(12) United States Patent
Koike

(10) Patent No.: US 7,225,215 B2
(45) Date of Patent: May 29, 2007

(54) ADAPTIVE FILTER EMPLOYING ADAPTIVELY CONTROLLED FORGETTING FACTOR AND ADAPTIVELY CONTROLLING METHOD OF FORGETTING FACTOR

(75) Inventor: Shinichi Koike, Tokyo (JP)

(73) Assignee: NEC Corporation, Tokyo (JP)

( * ) Notice: Subject to any disclaimer, the term of this patent is extended or adjusted under 35 U.S.C. 154(b) by 655 days.

(21) Appl. No.: 10/395,286

(22) Filed: Mar. 25, 2003

(65) Prior Publication Data
US 2003/0185294 A1 Oct. 2, 2003

(30) Foreign Application Priority Data
Mar. 28, 2002 (JP) ............................ 2002-092732

(51) Int. Cl.
*G06F 17/10* (2006.01)
(52) U.S. Cl. .................................... 708/322
(58) Field of Classification Search ................. 708/322
See application file for complete search history.

(56) References Cited

U.S. PATENT DOCUMENTS 4,607,326 A * 8/1986 Mori et al. .................... 700/42
6,532,454 B1 * 3/2003 Werbos ........................ 706/14
2002/0110188 A1 * 8/2002 Ohmori et al. .............. 375/232
2004/0210172 A1 * 10/2004 Palazzolo et al. ............. 601/41

FOREIGN PATENT DOCUMENTS

| JP | H10-508383 A | 5/1997 |
| JP | H9-139696 A | 8/1998 |

* cited by examiner

*Primary Examiner*—Tan V. Mai
(74) *Attorney, Agent, or Firm*—Sughrue Mion, PLLC

(57) ABSTRACT

An adaptive filter, employing an adaptively controlled forgetting factor, includes a first circuit for determining a gradient of an error signal and a second circuit for determining a value of the forgetting factor. The value of the forgetting factor is updated based on comparing the gradient of the error signal to the forgetting factor. Equations to update the forgetting factor may be solved using a recursive least squares algorithm. Comparing the gradient of the error signal to the forgetting factor may include, for example, dividing the error signal gradient by a compliment of the forgetting factor. A method for updating the forgetting factor includes determining the gradient of the error signal, determining a value of the forgetting factor, and updating the value of the forgetting factor based on comparing the gradient of the error signal to the forgetting factor. The forgetting factor may be stored in the adaptive filter.

15 Claims, 3 Drawing Sheets

ADAPTIVE FILTER EMPLOYING ADAPTIVELY CONTROLLED FORGETTING FACTOR AND ADAPTIVELY CONTROLLING METHOD OF FORGETTING FACTOR

BACKGROUND OF THE INVENTION

The present invention relates to an adaptive filter employing an adaptively controlled forgetting factor and an adaptively controlling method of the forgetting factor, which are utilized in an echo canceller using at data transmission and an audio system, in an automatic equalizer for digital data transmission, and also are generally utilized in the identification of unknown systems.

DESCRIPTION OF THE RELATED ART

First, the principle of an adaptive filter is explained. FIG. 1 is a block diagram showing the principle of the adaptive filter. The adaptive filter generates an estimator of an unknown signal based on a known filter reference input signal. And the adaptive filter updates parameters in the adaptive filter based on an error signal between the unknown signal and this estimator, and identifies an unknown system accurately.

Noise at the time of general observation has been added to the unknown signal. The adaptive filter converges to a final steady state by starting from an initial state being a not learning state. There are many cases that the unknown signal is given as a response of the unknown system to the filter reference input signal. An echo canceller and an automatic equalizer correspond to this case.

In many cases, the adaptive filter is realized by a FIR (finite impulse response) type filter, at this case, the adaptive filter controls N pieces of tap weights c0,c1, . . . ,cN−1 by using an error signal e (n). At the present invention, a recursive least squares algorithm is used as a controlling algorithm for the tap weights.

The update equations for the tap weights and so forth are given by the following. Hereinafter, _ is referred to as a vector or a matrix. The update equation of the tap weights is given as $\underline{c}(n+1)$, the update equation of a Kalman gain is given as $\underline{g}(n)$, and the estimator for an inverse covariance matrix of the filter reference input signal vector is given as $\underline{P}(n+1)$.

$$\underline{c}(n+1) = \underline{c}(n) + e(n)\underline{g}(n) \quad (1)$$

$$\underline{g}(n) = \underline{P}(n)\underline{a}(n) / \{\lambda + \underline{a}^T(n)\underline{P}(n)\underline{a}(n)\} \quad (2)$$

$$\underline{P}(n+1) = \{\underline{P}(n) - \underline{g}(n)\underline{a}^T(n)\underline{P}(n)\} / \lambda \quad (3)$$

where "n" is a time instant, $\underline{c}(n)$ is a tap weight vector and the $\underline{c}(n) = [c0(n), c1(n), \ldots, cN-1(n)]^T$, $\underline{a}(n)$ is a filter reference input signal vector and the $\underline{a}(n) = [a(n), a(n-1), \ldots, a(n-N+1)]^T$, and a(n) is a filter reference input signal sequence, e (n) is an error signal, $\lambda$ is a parameter called a forgetting factor, and $(\bullet)^T$ denotes the transpose of a vector or a matrix. That is, $\underline{c}$, $\underline{g}$, $\underline{P}$, and $\underline{a}$ denote a vector or a matrix.

The requiring amount of operation is large by the recursive least squares algorithm, however, when it is compared with a well-known LMS (least mean square) algorithm, the recursive least squares algorithm gives faster convergence for a colored reference input.

In case that an adaptive filter utilized the recursive least squares algorithm is used to identify a response from an unknown system, when the response is nonstationary time-variant, not being stationary time-invariant, it is well known that there exists an optimum value of the forgetting factor. In this case, the MSE (mean square error) becomes minimum for the optimum forgetting factor. Since the unknown system being nonstationary time-variant is not known beforehand, the optimum forgetting factor is also unknown.

Therefore, at identifying the unknown system being nonstationary time-variant, it is required that the MSE is made to be minimum, by controlling the forgetting factor optimally.

SUMMARY OF THE INVENTION

It is therefore an object of the present invention to provide an adaptive filter employing an adaptively controlled forgetting factor and an adaptively controlling method of the forgetting factor, in which the MSE can be made to be minimum by controlling the forgetting factor optimally.

According to a first aspect of the present invention, for achieving the object mentioned above, there is provided an adaptive filter employing an adaptively controlled forgetting factor, adopted an adaptive filter system using a recursive least squares algorithm. And adaptive control is carried out by that the forgetting factor is updated by using a gradient of an error signal with respect to the forgetting factor.

According to a second aspect of the present invention, in the first aspect, the adaptive filter employing the adaptively controlled forgetting factor provides a first multiplying means that multiplies an error signal at time "n" by an error signal at time "n+1", which was delayed by one unit time from the time "n", an inner product of vectors calculating means that calculates an inner product of a filter reference input signal vector at time "n+1" and a Kalman gain vector at time "n", a second multiplying means that multiplies the output from the first multiplying means by the output from the inner product of vectors calculating means, a dividing means that divides the output from the second multiplying means by a complementary forgetting factor (complement of the forgetting factor with respect to 1) at time "n", a third multiplying means that multiplies the output from the dividing means by a coefficient for adaptation, an adding means that adds the output from the third multiplying means and the complementary forgetting factor at time "n", a delaying means that delays the output from the adding means by one unit time, and a subtracting means that subtracts the output from the delaying means from "1". And the complementary forgetting factor at time "n", inputted to the dividing means and the adding means, is a feedback signal from the delaying means.

According to a third aspect of the present invention, in the second aspect, the adaptive filter employing the adaptively controlled forgetting factor further provides a signum detecting means that detects signums of the error signals at time "n" and at time "n+1".

According to a fourth aspect of the present invention, in the second aspect, the inner product of vectors calculating means calculates the inner product of the filter reference input signal vector at time "n+1" and the filter reference input signal vector at time "n", instead of, and the Kalman gain vector at time "n".

According to a fifth aspect of the present invention, for achieving the object mentioned above, there is provided an adaptively controlling method of a forgetting factor in an adaptive filter, adopted an adaptive filter system using a recursive least squares algorithm. And adaptive control is carried out by that the forgetting factor is updated by using a gradient of an error signal with respect to the forgetting factor.

According to a sixth aspect of the present invention, in the fifth aspect, the adaptively controlling method of the forgetting factor in the adaptive filter provides the steps of; multiplying an error signal at time "n" by an error signal at time "n+1", which was delayed by one unit time from the time "n", calculating an inner product of a filter reference input signal vector at time "n+1" and a Kalman gain vector at time "n", multiplying the multiplied result of the error signals at time "n" and at time "n+1" by the calculated inner product, dividing the multiplied result of the error signals at time "n" and at time "n+1" and the calculated inner product result by a complementary forgetting factor at time "n", multiplying the divided result by a coefficient for adaptation, adding the multiplied result by the coefficient for adaptation and the complementary forgetting factor at time "n", delaying the added result by one unit time, and subtracting the delayed result from "1". And the complementary forgetting factor at time "n" is a feedback signal of the delayed result.

According to a seventh aspect of the present invention, in the sixth aspect, the adaptively controlling method of the forgetting factor in the adaptive filter further provides the step of detecting signums of the error signals at time "n" and at time "n+1".

According to an eighth aspect of the present invention, in the sixth aspect, the calculating of the inner product calculates the inner product of the filter reference input signal vector at time "n+1" and the filter reference input signal vector at time "n", instead of the Kalman gain vector at time "n".

BRIEF DESCRIPTION OF THE DRAWINGS

The objects and features of the present invention will become more apparent from the consideration of the following detailed description taken in conjunction with the accompanying drawings in which.

DESCRIPTION OF EXEMPLARY EMBODIMENTS

Figure 1:
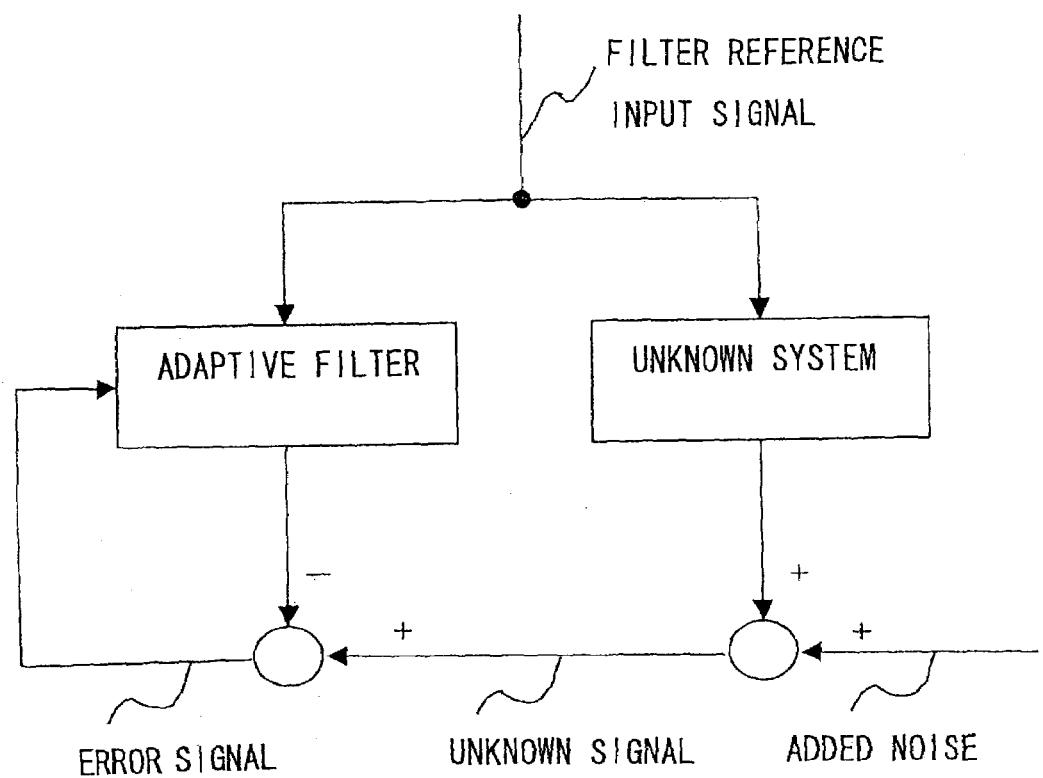
FIG. 1 is a block diagram showing the principle of an adaptive filter.

Referring now to the drawings, an embodiment of the present invention is explained in detail.

As mentioned above, at the embodiment of the present invention, an adaptive filter employing an adaptively controlled forgetting factor and an adaptively controlling method of the forgetting factor are provided. For achieving this, a gradient of an error signal with respect to a forgetting factor is used. At the embodiment of the present invention, the update equations for the forgetting factor are given by the following.

$$\lambda(n)=1-\lambda c(n) \quad (4)$$

$$\lambda c(n+1)=\lambda c(n)+\rho_G e(n+1)e(n)\underline{a}^T(n+1)\underline{g}(n)/\lambda c(n) \quad (5)$$

where the $\lambda(n)$ is a forgetting factor at time "n", the $\lambda c$ (n) is a complementary forgetting factor at time "n", and the $\rho_G$ is a coefficient for adaptation. As mentioned above, the $\underline{g}$ (n) is a Kalman gain, $\underline{a}$ (n) is a filter reference input signal vector, e (n) is an error signal, and $(\cdot)^T$ denotes the transpose of a vector or a matrix.

Figure 2:
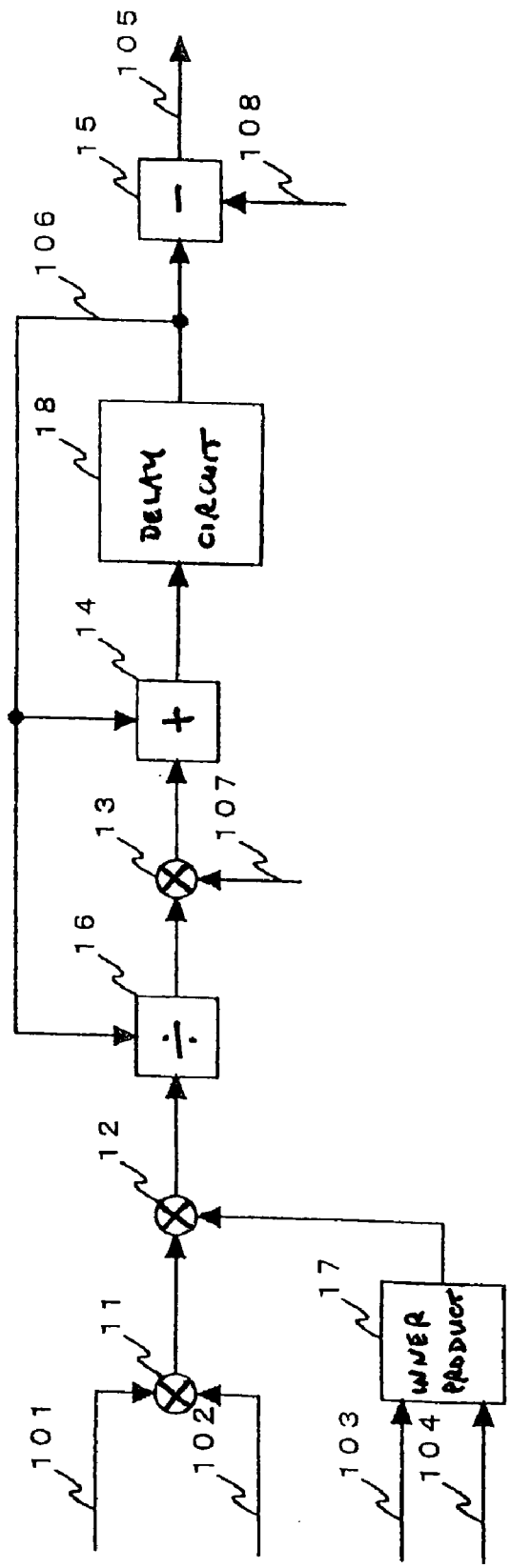
FIG. 2 is a block diagram showing a structure of an adaptive filter employing an adaptively controlled forgetting factor at an embodiment of the present invention.

FIG. 2 is a block diagram showing a structure of the adaptive filter employing an adaptively controlled forgetting factor at the embodiment of the present invention. As shown in FIG. 2, the adaptive filter employing the adaptively controlled forgetting factor at the embodiment of the present invention consists of a multiplier 11, an inner product of vectors calculator 17, a multiplier 12, a divider 16, a multiplier 13, an adder 14, a delay circuit 18, and a subtracter 15.

An input signal 101 is an error signal e (n+1) at time "n+1", and an input signal 102 is an error signal e (n) at time "n". The multiplier 11 calculates the product of the input signals 101 and 102. An input vector 103 is a filter reference input signal vector $\underline{a}$(n+1) at time "n+1", and an input vector 104 is a Kalman gain $\underline{g}$(n) at time "n". The inner product of vectors calculator 17 calculates the inner product $\underline{a}^T$ (n+1) $\underline{g}$(n).

The multiplier 12 calculates the product of the output from the multiplier 11 and the output from the inner product of vectors calculator 17. A signal 106, which is transmitted from the delay circuit 18 via a feedback route, is a complementary forgetting factor $\lambda c$ (n), and the divider 16 divides the output from the multiplier 12 by the signal 106. The quotient being the output from the divider 16 is inputted to the multiplier 13. The multiplier 13 calculates the product of the quotient and a coefficient for adaptation 107, which is inputted to the multiplier 13.

The adder 14 adds the signal 106 (the complementary forgetting factor $\lambda c$ (n)), which was transmitted from the delay circuit 18 via the feedback route, to the output from multiplier 13. The sum at the adder 14 is given to the delay circuit 18, whose delay time is one unit time, and the sum is delayed for one unit time. The output from the delay circuit 18 is the signal 106, and the signal 106 is also inputted to subtracter 15, and the subtracter 15 subtracts the signal 106 from an input signal 108 being a value "1". The subtracted result becomes an output 105. The output 105 is none other than the forgetting factor $\lambda$(n).

The embodiment mentioned above is a circuit that the equations (4) and (5) were realized as a concrete circuit. At the block diagram shown in FIG. 2, the order of the multipliers and divider can be changed.

The modified equation of the equation (5) is given by the following equation (6) or (7).

$$\lambda c(n+1)=\lambda c(n)+\rho_G sgn\{e(n+1)\}sgn\{e(n)\}\underline{a}^T(n+1) \\ \underline{g}(n)/\lambda c(n) \quad (6)$$

$$\lambda c(n+1)=\lambda c(n)+\rho_G e(n+1)e(n)\underline{a}^T(n+1)\underline{a}(n)/\lambda c(n) \quad (7)$$

In the equation (6), sgn (•) denotes a signum function, and in the equation (7), the filter reference input signal vector $\underline{a}$(n) is used, instead of using the Kalman gain $\underline{g}$(n). By using the equation (6) or (7), the effect being the same as that using the equation (5) can be obtained.

Figure 3:
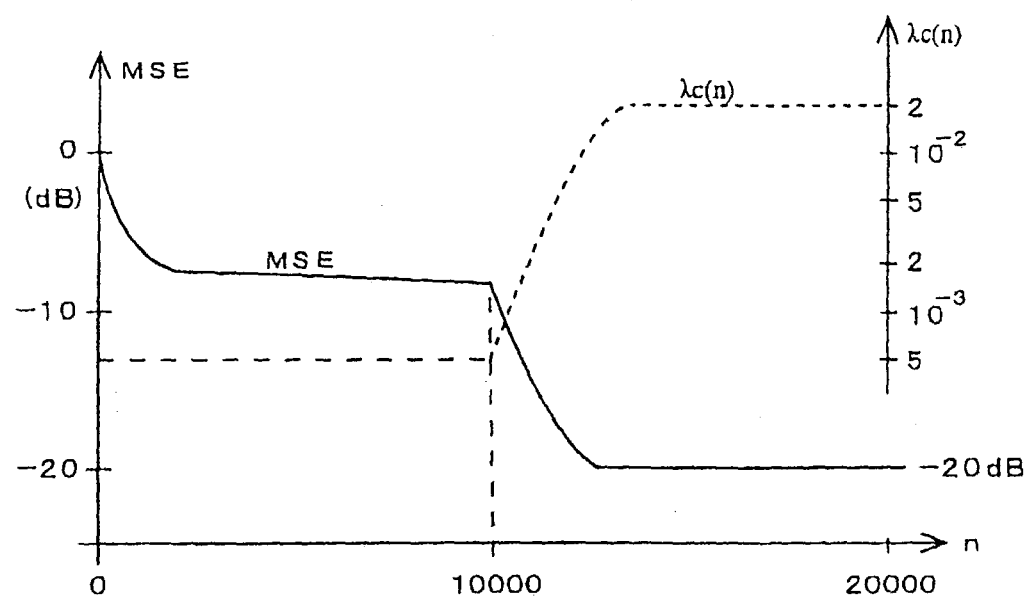
FIG. 3 is a graph showing a result of a computer simulation at the embodiment of the present invention.

FIG. 3 is a graph showing a result of a computer simulation at the embodiment of the present invention. In this, an unknown system being nonstationary time-variant is assumed to be a random walk model. Since at the initial state, an unknown system being stationary time-invariant is assumed, and the complementary forgetting factor $\lambda c$ (n) is selected as a small value so that the MSE becomes small, in case that the unknown system is the nonstationary time-variant, the MSE becomes −8 dB after the adaptive filter was converged.

When an adaptively controlling method of the forgetting factor is started at time n=10000, the MSE reached to −20 dB, and the MSE was improved by the value being more than 10 dB. Actually, in this example, the minimum MSE value for the optimum forgetting factor is −20 dB. That is, the optimum controlling of the forgetting factor is achieved. In FIG. 3, the change of the complementary forgetting factor λc (n) is also shown, and it can be seen that the complementary forgetting factor λc (n) is controlled to the optimum value from the initial small value.

At the embodiment of the present invention mentioned above, an adaptive filter employing an adaptively controller forgetting factor is realized by using a circuit, however, the adaptive filter employing the adaptively controlled forgetting factor can be realized by digital processing using a DSP (digital signal processor).

As mentioned above, according to the present invention, the MSE is made to be minimum by controlling the forgetting factor optimally, consequently, an unknown system can be identified accurately.

While the present invention has been described with reference to the particular illustrative embodiment, it is not to be restricted by that embodiment but only by the appended claims. It is to be appreciated that those skilled in the art can change or modify the embodiment without departing from the scope and spirit of the present invention.

What is claimed is:

1. An adaptive filter employing an adaptively controlled forgetting factor, wherein the filter comprises:
a first circuit for determining a gradient of an error signal; and
a second circuit for determining a value of the forgetting factor;
wherein the value of the forgetting factor is updated based on comparing the gradient of the error signal to the forgetting factor.

2. The filter of claim 1, wherein comparing the gradient of the error signal to the forgetting factor comprises:
dividing the gradient of the error signal by a compliment of the forgetting factor.

3. The filter of claim 1, wherein the gradient of the error signal is given by $$gradient = e(n+1)*e(n),$$

wherein e(n) represents the error signal at time "n", and
wherein e(n+1) represents the error signal at time "n+1".

4. The filter of claim 1, wherein the gradient of the error signal is given by $$gradient = sgn[e(n+1)]*sgn[e(n)],$$

wherein e(n) represents the error signal at time "n",
wherein e(n+1) represents the error signal at time "n+1",
wherein sgn[e(n)] represents a value of the signum function evaluated at e(n), and
wherein sgn[e(n+1)] represents the value of the signum function evaluated at e(n+1).

5. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*e(n+1)*e(n)*[a^T(n+1)g(n)]/\lambda_c(n);$$

wherein $\lambda(n)$ represents the forgetting factor at time "n",
wherein $\lambda_c(n)$ represents a complementary forgetting factor at time "n",
wherein $\lambda_c(n+1)$ represents the complementary forgetting factor at time "n+1",
wherein $\rho_G$ represents a coefficient for adaptation,
wherein e(n) represents the error signal at time "n",
wherein e(n+1) represents the error signal at time "n+1",
wherein a(n+1) represents a filter reference input signal vector at time (n+1),
wherein $a^T(n+1)$ represents a transpose of the filter reference input signal vector a(n+1), and
wherein g(n) represents a Kalman gain vector at time "n".

6. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*e(n+1)*e(n)*[g^T(n)a(n+1)]/(n);$$

wherein $\lambda(n)$ represents the forgetting factor at time "n",
wherein $\lambda_c(n)$ represents a complementary forgetting factor at time "n",
wherein $\lambda_c(n+1)$ represents the complementary forgetting factor at time "n+1",
wherein $\rho_G$ represents a coefficient for adaptation,
wherein e(n) represents the error signal at time "n",
wherein e(n+1) represents the error signal at time "n+1",
wherein g(n) represents a Kalman gain vector at time "n",
wherein $g^T(n)$ represents a transpose of the Kalman gain vector g(n), and
wherein a(n+1) represents a filter reference input signal vector at time (n+1).

7. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*sgn[e(n+1)]*sgn[e(n)]*[a^T(n+1)g(n)]/\lambda_c(n);$$

wherein $\lambda(n)$ represents the forgetting factor at time "n",
wherein $\lambda_c(n)$ represents a complementary forgetting factor at time "n",
wherein $\lambda_c(n+1)$ represents the complementary forgetting factor at time "n+1",
wherein $\rho_G$ represents a coefficient for adaptation,
wherein e(n) represents the error signal at time "n",
wherein sgn[e(n)] represents a value of the signum function evaluated at e(n),
wherein e(n+1) represents the error signal at time "n+1",
wherein sgn[e(n+1)] represents the value of the signum function evaluated at e(n+1),
wherein a(n+1) represents a filter reference input signal vector at time (n+1),
wherein $a^T(n+1)$ represents a transpose of the filter reference input signal vector a(n+1), and
wherein g(n) represents a Kalman gain vector at time "n".

8. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*sgn[e(n+1)]*sgn[e(n)]*[g^T(n)a(n+1)]/\lambda_c(n);$$

wherein λ(n) represents the forgetting factor at time "n",
wherein $\lambda_c$(n) represents a complementary forgetting factor at time "n",
wherein $\lambda_c$(n+1) represents the complementary forgetting factor at time "n+1",
wherein $\rho_G$ represents a coefficient for adaptation,
wherein e(n) represents the error signal at time "n",
wherein sgn[e(n)] represents a value of the signum function evaluated at e(n),
wherein e(n+1) represents the error signal at time "n+1",
wherein sgn[e(n+1)] represents the value of the signum function evaluated at e(n+1),
wherein g(n) represents a Kalman gain vector at time "n",
wherein $g^T$(n) represents a transpose of the Kalman gain vector g(n), and
wherein a(n+1) represents a filter reference input signal vector at time (n+1).

9. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*e(n+1)*e(n)*[a^T(n+1)a(n)]/\lambda(n);$$

wherein λ(n) represents the forgetting factor at time "n",
wherein $\lambda_c$(n) represents a complementary forgetting factor at time "n",
wherein $\lambda_c$(n+1) represents the complementary forgetting factor at time "n+1",
wherein $\rho_G$ represents a coefficient for adaptation,
wherein e(n) represents the error signal at time "n",
wherein e(n+1) represents the error signal at time "n+1",
wherein a(n+1) represents a filter reference input signal vector at time (n+1),
wherein $a^T$(n+1) represents a transpose of the filter reference input signal vector a(n+1), and
wherein a(n) represents the filter reference input signal vector at time (n).

10. The filter of claim 1, wherein the forgetting factor is updated based on equations comparing the gradient of the error signal to the forgetting factor, and
wherein the equations for updating the forgetting factor are given by:

$$\lambda(n)=1-\lambda_c(n); \text{ and}$$

$$\lambda_c(n+1)=\lambda_c(n)+\rho_G*e(n+1)*e(n)*[a^T(n)a(n+1)]/\lambda_c(n);$$

wherein λ(n) represents the forgetting factor at time "n",
wherein $\lambda_c$(n) represents a complementary forgetting factor at time "n",
wherein $\lambda_c$(n+1) represents the complementary forgetting factor at time "n+1",
wherein $\rho_G$ represents a coefficient for adaptation,
wherein e(n) represents the error signal at time "n",
wherein e(n+1) represents the error signal at time "n+1",
wherein a(n) represents a filter reference input signal vector at time (n),
wherein $a^T$(n) represents a transpose of the filter reference input signal vector a(n), and
wherein a(n+1) represents the filter reference input signal vector at time (n+1).

11. The filter of claim 1, wherein the forgetting factor is updated based on equations comparing the gradient of the error signal to the forgetting factor, and
wherein the update equations are solved using a recursive least squares algorithm.

12. An adaptive filter employing an adaptively controlled forgetting factor, comprising:
a first circuit for multiplying an error signal at time "n" times the error signal at time "n+1", yielding a first result;
a second circuit for calculating an inner product of a filter reference input signal vector at time "n+1" and a second vector, yielding a second result;
a third circuit for multiplying the first result times the second result, yielding a third result;
a fourth circuit for dividing the third result by a complementary forgetting factor at time "n", yielding a fourth result;
a fifth circuit for multiplying the fourth result times a coefficient for adaptation, yielding a fifth result;
a sixth circuit for adding the complimentary forgetting factor at time "n" to the fifth result, yielding a sixth result;
a seventh circuit for delaying the sixth result by one unit of time, yielding the complimentary forgetting factor; and
an eighth circuit for subtracting the complementary forgetting factor from "1", yielding an updated forgetting factor.

13. The filter of claim 12, wherein the second vector is a Kalman gain vector at time "n".

14. The filter of claim 12, wherein the second vector is the filter reference input signal vector at time "n".

15. The filter of claim 12, further comprising:
a ninth circuit for detecting signums of the error signal at time "n" and at time "n+1".

* * * * *